United States Patent
Alok

(10) Patent No.: US 6,407,014 B1
(45) Date of Patent: Jun. 18, 2002

(54) METHOD ACHIEVING HIGHER INVERSION LAYER MOBILITY IN NOVEL SILICON CARBIDE SEMICONDUCTOR DEVICES

(75) Inventor: Dev Alok, Danbury, CT (US)

(73) Assignee: Philips Electronics North America Corporation, New York, NY (US)

(*) Notice: Subject to any disclaimer, the term of this patent is extended or adjusted under 35 U.S.C. 154(b) by 0 days.

(21) Appl. No.: 09/464,862

(22) Filed: Dec. 16, 1999

(51) Int. Cl.[7] .................. H01L 21/302; H01L 21/31
(52) U.S. Cl. .............. 438/931; 438/705; 438/766; 438/966; 438/969
(58) Field of Search .................. 438/766, 931, 438/966, 969, 705

(56) References Cited

U.S. PATENT DOCUMENTS

| | | | | |
|---|---|---|---|---|
| 4,478,654 A | * | 10/1984 | Gau et al. ................ | 438/482 |
| 4,757,028 A | * | 7/1988 | Kondoh et al. ............ | 438/571 |
| 5,087,576 A | * | 2/1992 | Edmond et al. ........... | 438/522 |
| 5,270,244 A | | 12/1993 | Baliga ...................... | 438/440 |
| 5,272,107 A | * | 12/1993 | Suzuki et al. ............. | 438/590 |
| 5,318,915 A | | 6/1994 | Baliga et al. ............. | 438/520 |
| 5,322,802 A | | 6/1994 | Baliga et al. ............. | 438/268 |
| 5,338,945 A | | 8/1994 | Baliga et al. ............. | 257/77 |
| 5,406,096 A | | 4/1995 | Malhi ....................... | 257/114 |
| 5,436,174 A | | 7/1995 | Baliga et al. ............. | 438/705 |
| 5,449,925 A | | 9/1995 | Baliga et al. ............. | 257/77 |
| 5,459,107 A | * | 10/1995 | Palmour .................... | 438/763 |
| 5,471,946 A | * | 12/1995 | Scholz et al. ............. | 117/84 |
| 5,543,637 A | | 8/1996 | Baliga ...................... | 257/77 |
| 5,569,932 A | * | 10/1996 | Shor et al. ................ | 257/3 |
| 5,698,472 A | * | 12/1997 | Harris ................ | 148/DIG. 148 |
| 5,723,376 A | * | 3/1998 | Takeuchi et al. ......... | 438/270 |
| 5,972,801 A | * | 10/1999 | Lipkin et al. ............. | 438/770 |
| 6,163,066 A | * | 12/2000 | Forbes et al. ............ | 257/632 |
| 6,303,508 B1 | * | 10/2001 | Alok ........................ | 438/705 |

FOREIGN PATENT DOCUMENTS

| | | | | |
|---|---|---|---|---|
| GB | 2306250 A | 4/1997 | ........... | G01L/29/78 |
| JP | 55-24482 A | 2/1980 | ........ | H01L/21/205 |
| JP | 07082098 A | 3/1995 | ........... | C30B/33/00 |

OTHER PUBLICATIONS

"A Novel Method for Etching Trenches in Silicon Carbide", by Dev Alok et al., Journal of Electronic Materials, vol. 24, No. 4, 1995, pp. 311–314.

* cited by examiner

Primary Examiner—Eddie Lee
Assistant Examiner—José R Díaz
(74) Attorney, Agent, or Firm—Ernestine C. Bartlett

(57) ABSTRACT

The invention provides a method for the production of high quality thermally grown oxide on top of silicon carbide. The high quality oxide is obtained by selectively removing the carbon from the silicon carbide in the areas where oxide formation is desired or required. The method includes the steps of:

(a) amorphizing the silicon carbide in at least one region of a monocrystalline silicon carbide substrate by ion implantation;

(b) removing at least an effective amount of the carbon resulting from amorphizing the silicon carbide with an etchant effective to selectively remove carbon from the amorphized silicon carbide to produce an amorphous silicon-rich region; and (c) forming an oxide on the etched surface to provide a device which has an oxide region on (1) either an amorphous silicon-rich region which is (i) predominantly or entirely amorphous silicon or (ii) a mixture of predominantly amorphous silicon in combination with minor amounts of amorphous silicon carbide and /or silicon dioxide or (2) a monocrystalline silicon region;

wherein (1) or (2) is present on a region of a silicon carbide substrate, or (3) a region of a silicon carbide substrate.

21 Claims, 2 Drawing Sheets

METHOD ACHIEVING HIGHER INVERSION LAYER MOBILITY IN NOVEL SILICON CARBIDE SEMICONDUCTOR DEVICES

RELATED APPLICATION

This invention is related to my invention set forth in Ser. No. 09/464,861, now U.S. Pat. No. 6,303,508 B1, "Superior Silicon Carbide Integrated Circuits and Method of Fabricating", filed concurrently herewith.

FIELD OF THE INVENTION

This invention relates to a novel method of achieving low interface states between the interface of silicon carbide and thermally grown oxide and to novel silicon carbide semiconductor devices derived therefrom.

BACKGROUND OF THE INVENTION

Silicon carbide is a superior semiconductor material for the production of power MOSFET and Schottky barrier rectifiers. Indeed, silicon carbide MOSFETs have been reported with blocking voltages as high as 1400V. However, the on-resistance of these MOSFETs are orders-of-magnitude higher than is theoretically predicted for similarly rated ideal silicon carbide unipolar devices. The reason for this large on-resistance has primarily been the low inversion layer mobility, which is believed to be less than 10 $cm_2/Vs$ for these MOSFETs. This value of inversion layer mobility is more than two orders-of-magnitude lower than the bulk silicon carbide mobility. This low inversion layer mobility for silicon carbide MOSFETS is primarily due to the large interface state density between silicon carbide and thermally grown oxide. The lowest interface state density on p-type silicon carbide of which we are aware is $1 \times 10^{11}$ cm$_{-2}$ eV$_{-1}$. This interface state density is much higher than the interface state density observed for MOS type devices in silicon technology, where this value is routinely observed to be about $1 \times 10^{10}$ cm$^{-2}$ eV$_{-1}$.

Additionally, silicon carbide is chemically inert in nature and is not attacked by most of the common etchants at room temperature due to the strong bond between carbon and silicon in monocrystalline silicon carbide. At the same time, the bonds between silicon and carbon in amorphous silicon carbide are weak. In my work with B. J. Baliga, it was reported that monocrystalline silicon carbide is not attacked by most of the common laboratory etchants, such as HF, $HNO_3$, KOH, HCl, etc.; that silicon is etched by using a hot mixture of HF and $HNO_3$, that carbon can be etched using hot $HNO_3$, and hence we suggested that monocrystalline silicon carbide be converted to amorphous silicon carbide and be etched by treating it as a mixture of silicon and carbon. See Alok et al, Journal of Electronic Materials, Vol. 24, No. 4, pp. 311–314, and the similar disclosure of U.S. Pat. No. 5,436,174, wherein this work is used to form a trench in a monocrystalline silicon substrate by directing first electrically inactive ions using ion implantation into a first portion of the monocrystalline silicon carbide substrate to create an amorphous silicon carbide region followed by removal of the first amorphous silicon carbide region to form a trench in the monocrystalline silicon carbide using an etchant which selectively etches amorphous silicon carbide at a higher rate than monocrystalline silicon carbide.

U.S. Pat. Nos. 5,318,915, 5,322,802, 5,436,174, and 5,449,925 use amorphization to create deep PN junctions or deep trenches in SiC wafers. However, these references do not produce integrated circuits, do not convert a SiC wafer part into silicon, and do not provide for improvement in speed and performance of integrated circuits. Other workers in the art (JPA 55024482 and JPA 07082098) have attempted to create SiC areas in a Si wafer by converting a thin layer of Si into SiC using ion implantation. Such thin layers can not be used to create high voltage (>1000V) vertical power devices. Moreover, attempts in our laboratory to convert part of a Si wafer to SiC using high temperature ion implantation were unsuccessful.

There is a continued need in the art for methods for achieving low interface states between the interface of silicon carbide regions and oxide regions, in particular thermally grown oxide regions, and thereby increasing the inversion layer mobility in silicon carbide MOS devices, and for novel silicon carbide semiconductor devices derived therefrom. There is also a continued need in the art for methods for creating silicon-rich regions in silicon carbide substrates such as silicon carbide wafers and for novel silicon carbide semiconductor devices derived therefrom.

SUMMARY OF THE INVENTION

An object of the invention is to increase the inversion layer mobility in silicon carbide MOS devices.

Another object of the invention is to increase the inversion layer mobility in silicon carbide MOS devices by reducing the interface states between selected silicon carbide regions and thermal oxide regions in said devices.

Another object of the invention is to provide method for creating silicon-rich regions in silicon carbide substrates such as silicon carbide wafers and to provide novel silicon carbide semiconductor devices derived therefrom.

These and other objects of the invention will be apparent from the description of the invention which follows.

It has been found that (i) the unwanted interface states in silicon carbide derived devices are attributed to carbon; (ii) carbon may be selectively removed to reduce the interface states between the silicon carbide region and oxide regions, either grown as a result of thermal oxidation, or by oxide deposition followed by thermal oxidation; and (iii) this reduction of interface states leads to increased inversion layer mobility and improved performance of silicon carbide MOS devices derived by the method of this invention and having such reduced interface states.

Thus in my present work, it is desired to selectively remove carbon from silicon carbide, using an etchant effective to selectively remove carbon that is present in silicon carbide, preferably an etchant that only attacks carbon and not silicon, or that etches carbon at a much faster rate than it etches silicon and/or silicon carbide. However, before any effective etching and removal of carbon from silicon carbide can be realized, it is necessary to break the bond between silicon and carbon that is present in the monocrystalline silicon carbide.

The invention relates to a method which comprises steps to remove at least an effective amount of carbon from a region, preferably a surface region, of silicon carbide prior to oxide formation on said region by: (a) performing at least one amorphizing step, preferably by ion implantation to a desired depth to convert at least an effective amount, preferably a substantial amount and most preferably all of selected regions of monocrystalline silicon carbide to regions of amorphous silicon carbide; (b) selectively removing or dissolving at least an effective amount of carbon from said amorphous silicon carbide region(s) through use of an etchant selective to carbon such as hot $HNO_3$ to form an amorphous silicon-rich region; and (c) forming an oxide on said amorphous silicon-rich region, preferably by subjecting the etched amorphous region to thermal oxidation or to an oxide deposition procedure followed by thermal oxidation.

The invention provides a method for the production of silicon carbide devices which have an oxide region on
(a) either an amorphous silicon-rich region which is (i) predominantly or entirely amorphous silicon or (ii) a mixture of predominantly amorphous silicon in combination with amorphous silicon carbide and /or silicon dioxide or
(b) a monocrystalline silicon region;
wherein (a) or (b) is present on a region of a silicon carbide substrate, or
(c) a region of a silicon carbide substrate,
and to novel silicon carbide devices derived therefrom. An outline of exemplary methods and regions created thereby is given in FIG. 1.

In specific embodiments, the method is used to produce high quality oxide on silicon carbide and/or silicon carbide devices having an oxide region on silicon carbide and includes the steps of:
(a) amorphizing silicon carbide in at least one region of a monocrystalline silicon carbide substrate to convert the silicon carbide in said region to amorphous silicon carbide on a monocrystalline silicon carbide substrate;
(b) removing at least an effective amount of the carbon from the resulting amorphous silicon carbide region with an etchant effective to selectively remove said effective amount of carbon from said amorphous silicon carbide region to produce an amorphous silicon-rich region on a monocrystalline silicon carbide substrate; and
(c) forming an oxide on said amorphous silicon-rich region on said monocrystalline silicon carbide substrate, preferably by (i)subjecting the etched region to thermal oxidation under conditions effective to preserve the amorphous silicon layer producing an oxide on an amorphous silicon-rich region on a monocrystalline silicon carbide substrate; or (ii)subjecting the etched region to thermal oxidation under conditions that substantially consume the amorphous silicon layer to produce an oxide on amonocrystalline silicon carbide substrate; or (iii)subjecting the etched region to thermal oxidation under conditions effective to preserve the amorphous silicon region and thereafter subjecting the said region to at least one high temperature thermal annealing step to produce an oxide on a crystalline silicon region on a monocrystalline silicon carbide substrate; or (iv) forming LTO on the etched region and then subjecting the LTO-bearing etched region to thermal oxidation and high temperature anneal to produce an LTO region on a monocrystalline silicon carbide substrate.

Thus, the invention provides a method for the production of high quality thermally grown oxide on top of silicon carbide which method reduces the interface states density and improves the inversion layer mobility by removing carbon from silicon carbide as described above.

It will be understood that the term "effective amount" means that amount of carbon which when removed or that amount of silicon carbide which when amorphized and etched according to the invention is effective to reduce the interface states density between the silicon carbide region and the oxide region and thereby result in an improvement of the inversion layer mobility when compared to interface states density and inversion layer mobility of the unamorphized and/or unetched silicon carbide.

The carbon need only be removed from the top surface as that is the only silicon carbide region which would be consumed during the oxidation process. However, the invention is not restricted to amorphization and removal of carbon from the only the surface nor to treatment of any particular area of a substrate. Rather the invention contemplates a technique which selectively removes carbon from a selected region(s) of a silicon substrate, such as a silicon carbide wafer. Once the carbon is removed, thermal oxidation can be performed to provide a device having reduced interface states between the silicon carbide and thermal oxide. The invention makes it possible to increase inversion layer mobility in SiC MOS devices. These MOSFET devices are useful as SiC high voltage (>1000V ) ICs and may be used for a variety of commercial and military applications such as in locomotives, electric cars, combat vehicles, aircraft, lighting, etc. This aspect of the invention may be used to form low voltage and high voltage devices monolithically on a single chip as described and claimed in my copending application Ser. No. 09/464,861 now U.S. Pat. No. 6,303,508 B1, "Superior Silicon Carbide Integrated Circuits and Method of Fabricating", filed concurrently herewith.

DETAILED DESCRIPTION OF THE PREFERRED EMBODIMENTS

Figure 1:
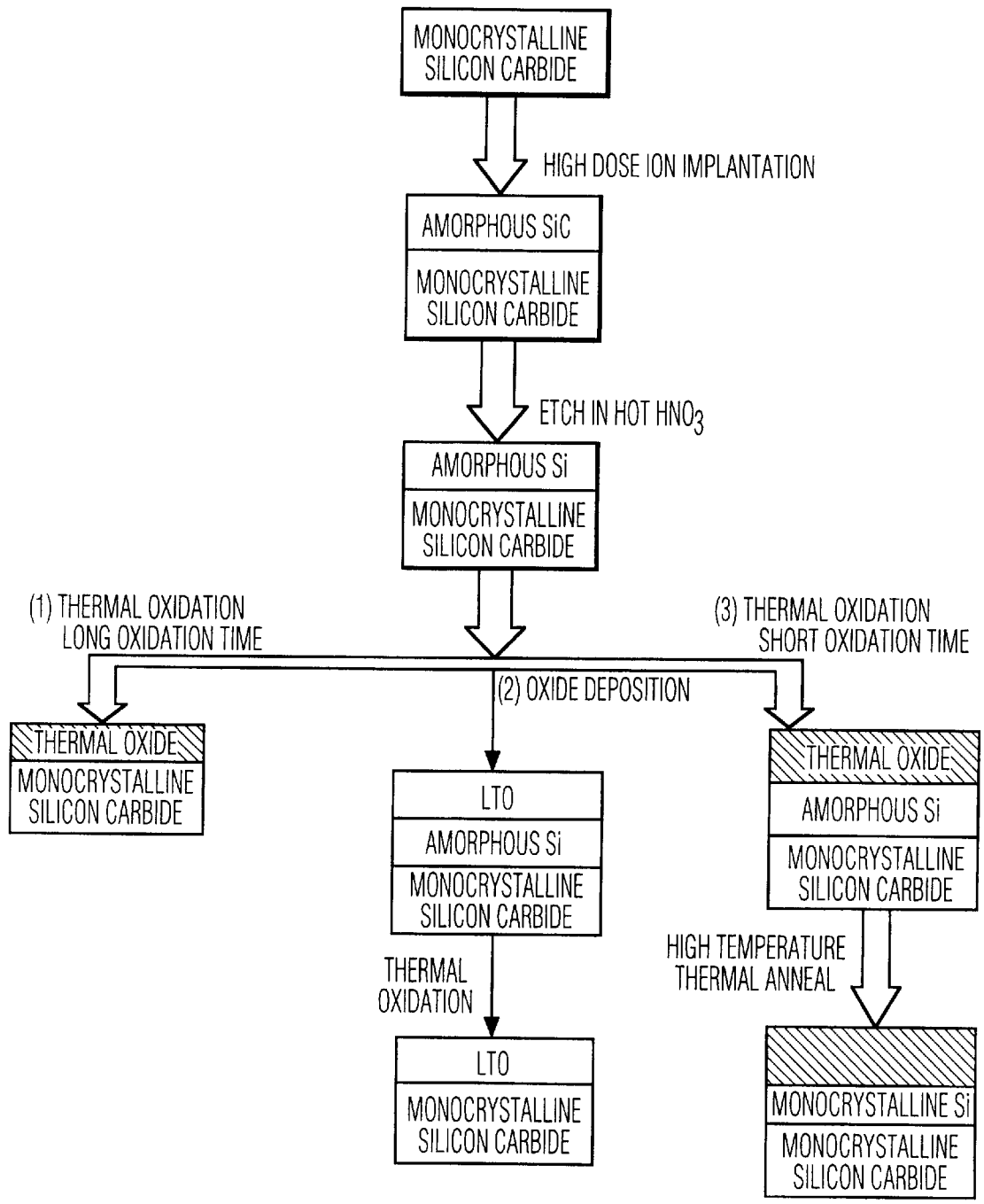
FIG. 1 is a flow diagram illustrating a process of the invention.

With reference to FIG. 1, there is illustrated a method which comprises the steps of:
(1) providing a monocrystalline silicon carbide substrate;
(2) subjecting at least a portion of a surface of the substrate to ion implantation to convert at least a portion of the substrate surface to amorphous silicon carbide producing a region of amorphous silicon carbide on a monocrystalline silicon carbide substrate;
(3) subjecting at least a portion of the amorphous silicon carbide region to an etchant material which selectively removes carbon from the amorphous silicon region produce a region of amorphous silicon on a monocrystalline silicon carbide substrate; and
(4) subjecting the monocrystalline substrate with at least a region of amorphous silicon to thermal oxidation.

The amorphization of silicon carbide in monocrystalline silicon carbide may be accomplished by any means effective to break the silicon to carbon bond and convert the monocrystalline silicon carbide to amorphous silicon carbide.

Preferably the amorphizing step comprises implanting ions into a portion of the monocrystalline silicon carbide substrate, such that a portion of the monocrystalline silicon carbide substrate is converted into amorphous silicon carbide. Preferably, this is accomplished by high dose ion implantation. Amorphization of a substrate by ion-implantation requires exceeding a critical dose. The energy and atomic weight of the incident ion governs the depth of the amorphous layer. This can be done with a variety of implant species with implant dose higher than the critical implant dose. Table I gives the critical dose required to create an amorphous layer in SiC along with the maximum amorphous layer depth which can be achieved using a 200 KeV implanter for some of the commonly available implant species. Multiple energy implants may be required to create uniform amorphous layers from surface to the maximum depth listed in Table 1.

TABLE I

Depth of amorphous region formed in SiC and the critical dose to obtain an amorphous layer using various impurities in a 200 keV implanter

| Implanted Species | Amorphous Layer (Å) | Critical Dose (cm$^{-2}$) |
|---|---|---|
| Ar$^{++}$ | 5000 | 7e14 |
| Ar$^{+}$ | 2100 | 5e14 |
| Al$^{+}$ | 3000 | 1e15 |
| C$^{++}$ | 6000 | 7e15 |
| He$^{+}$ | 9000 | 5e16 |
| Si$^{+}$ | 2800 | 8e14 |
| H$^{+}$ | 15000 | 2e18 |
| Ne$^{+}$ | 4000 | 2e15 |

Ion implantation into selected regions of a silicon carbide substrate may take place through a mask which exposes an area on the silicon carbide substrate face. Ions are then directed to the face of the silicon carbide substrate such that the ions implant into the silicon carbide substrate through the exposed area. Multiple implants at different energies may be performed, for example, at a dose of $1 \times 10^{15}$ cm$^{-2}$ using a photoresist mask with 50, 130, 200 KeV singly charged ions and with 150, 200 KeV doubly charged ions. Once the bond between silicon and carbon is broken and amorphization has taken place, the mask is removed and the amorphized silicon carbide is treated as a mixture of silicon and carbon. The carbon is removed by etching the amorphized region in a suitable etching agent, such as for example hot HNO$_3$, which is effective to dissolve the carbon component of the amorphized silicon carbide. After this the etched sample is subjected to oxide growth, preferably by thermal oxidation which will either consume the amorphous silicon region completely or partially, depending on the desired oxide thickness and the oxidation time employed.

As indicated in FIG. 1, if the oxidation period is chosen to be long enough, the final structure comprises a thermal oxide on a monocrystalline silicon carbide substrate and exhibits a lower interface states density and higher inversion layer mobility because of the substantial absence of carbon bonded to silicon as a result of being subjected to the steps of the method of this invention.

Alternatively, as is also indicated in FIG. 1, if the oxidation period is chosen to be insufficient to consume the entire amorphous region or layer as the case may be, an amorphous silicon-rich layer or region, preferably an amorphous silicon layer or region, is present between the thermal oxide and the monocrystalline silicon carbide. This amorphous silicon layer is than recrystallized, preferably by high temperature anneal at a temperature of about 1000° C. This yields a structure which has a monocrystalline silicon region on a monocrystalline silicon carbide region and underneath the thermal oxide. The effective mobility in this case may be higher than the bulk mobility of silicon carbide as the inversion layer is formed on monocrystalline silicon. This allows for the design of novel silicon carbide MOS devices in which the channel is formed on silicon surface while the voltage is supported in the silicon carbide region.

In another embodiment of the invention, also as shown in FIG. 1, an oxide (LTO) is formed on the etched sample, after which it is subjected to thermal oxidation and high temperature thermal anneal. This yields a structure that has a thick oxide on a monocrystalline silicon carbide region in which the inversion layer mobility is also increased.

In a power MOSFET, a gate electrode bias is applied for turn-on and turn-off control. Turn-on occurs when a conductive channel is formed in the base, between the MOSFET's source and drain regions, under an appropriate gate bias. The gate is separated from the channel by an intervening insulator, typically silicon dioxide. Because the gate is insulated from the channel, little if any gate current is required in either the on-state or the off-state. Power MOSFET's of the type described above have typically been formed in silicon. However, because of the physical, thermal and electrical properties of silicon carbide, it is believed that power MOSFETs formed of silicon carbide may provide significant advantages over silicon power MOSFETs. In particular, silicon carbide power devices can operate with lower specific on-resistance and have other advantages now as is well known in the art.

Figure 2:
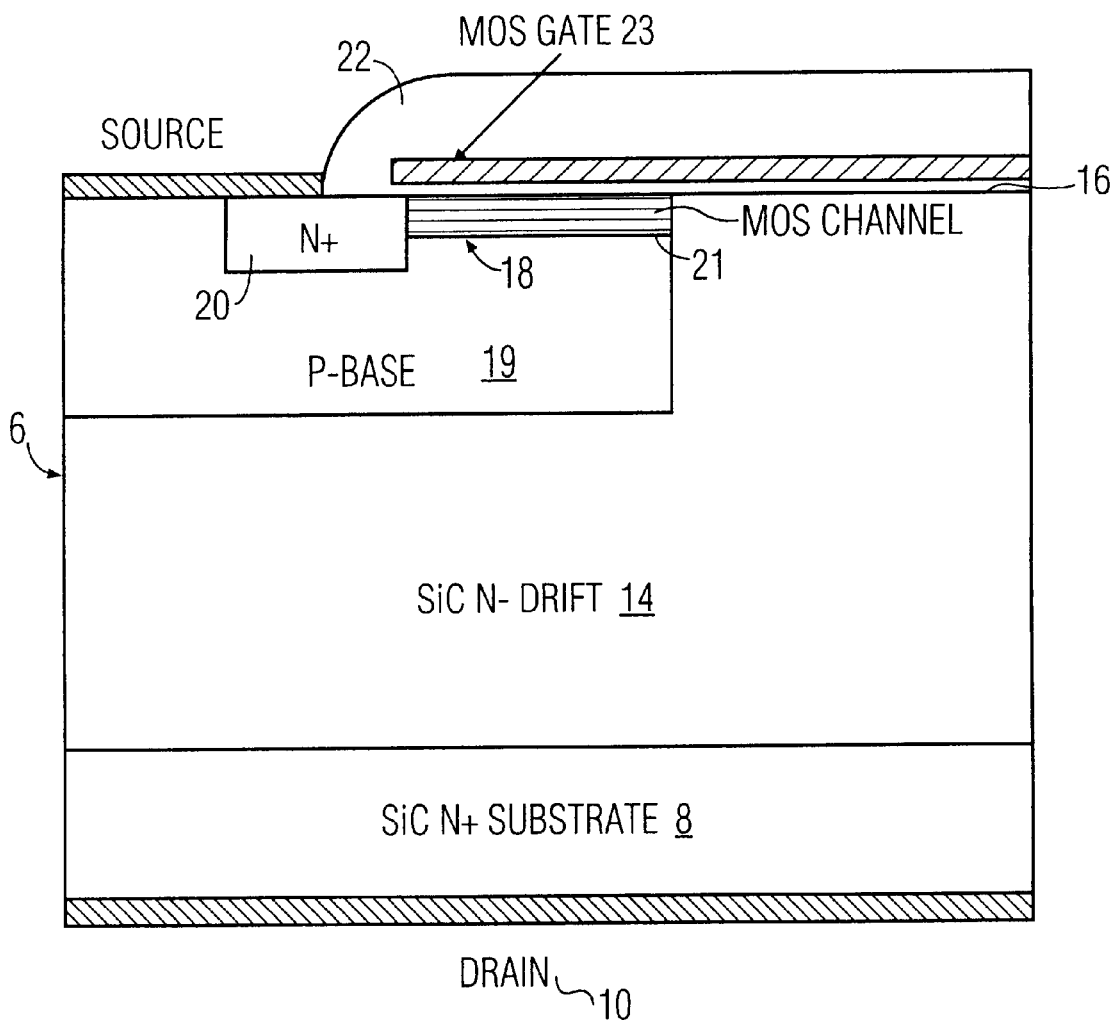
FIG. 2 is a cross-sectional representation of a novel SiC semiconductor device of the invention.

A typical device embodying the present invention has an increased inversion layer mobility and is shown in FIG. 2 wherein there is illustrated a device 6 having a monocrystalline silicon carbide substrate 8 of a first conductivity type (preferably N+) which includes a N-type region 14. According to the invention, appropriate dopant ions of second conductivity type are implanted to form the base region 19 of the semiconductor device. A second ion implantation with masking is performed to implant dopant ions of a first conductivity type, of preferably N+ type, region 20. The ion implantation step includes the steps of masking a second area on the face 16 and of patterning a mask so as to define the length of a channel 21. The region 20 corresponds to the source of the region of the field effect transistor to be formed. It will be obvious to those skilled in the art that the various ion implantation and doping steps may be performed in any order and may include an annealing step(s) to effectively activate the dopant ions. After the base region 19 and the source region 20 have been formed, an amorphizing step is performed to define amorphous region 18 in which ions are implanted with masking to form amorphous silicon carbide. In some cases the implanted and dopant ions may the same or different ions. The face 16 is then etched with appropriate etchant to remove carbon and to convert the amorphous silicon carbide areas including the area containing the channel 21 to amorphous silicon areas on a monocrystalline silicon carbide substrate 6. The amorphous silicon areas are then subjected to high temperature thermal anneal to convert the areas of amorphous silicon to form monocrystalline silicon regions in the monocrystalline silicon carbide substrate as desired. Thereafter or simultaneously, an insulating region 22 such as silicon oxide is formed on the face 16 using thermal oxidation. A gate conductive layer 23 is then deposited and patterned on the insulating region 22. The gate which preferably comprises polycrystalline silicon, is deposited and patterned on the insulating region using conventional techniques. The gate is preferably covered by the insulating region and the insulating region is patterned to provide a contact to the base and source. The contact metal (not shown) for providing contact to the source region and electrically connecting the source region to the base region is then deposited using conventional techniques. A drain metallization layer 10 is then applied on the back side of the substrate to complete the transistor fabrication. In such a device, the gate (23) and source (20) terminals are at the top surface and the drain terminal (10) is at the bottom. The carrier flow path is from the top source electrode (20), through the lateral channel (21) underneath the gate electrode (23), then vertically through the drift region (14) and N+ substrate (8), to the drain electrode (10).

According to the invention, a 4H—SiC wafer was subjected to argon implantation (dose=1e15 cm$^{-2}$; energy=30 keV) using the method of the invention described above.

Subsequently, the wafer was dipped in hot HNO$_3$ for 30 minutes to remove carbon from the ion-implanted region. The wafer was then characterized using X-ray photoelectron spectroscopy (XPS) to find out the composition in implanted and unimplanted regions. XPS showed that the unimplanted region of the wafer was unchanged and essentially SiC whereas the implanted region showed a reduction in carbon content. XPS also showed that the implanted region is predominantly Si; and most of the carbon present in the implanted region was in the form of hydrocarbon and not as SiC. Thus, according to the invention, it is possible to selectively remove carbon from SiC wafers to obtain Si-rich regions and to form these areas selectively on the SiC wafer, as desired. In this respect, the use of silicon is beneficial because of the high inversion layer mobility of Si compared to SiC. The remaining SiC area may be used to fabricate high voltage and high-current power devices. The result is a highly efficient monolithic IC which has the speed of Si low voltage devices and the power handling capability of SiC.

It will be appreciated by those skilled in the art that in the drawings and specification, there have been disclosed typical preferred embodiments of the invention and, although specific terms are employed, they are not used for purposes of limitation, the scope of the invention being set forth in the appended claims.

I claim:

1. A method for the production of high quality thermally grown oxide on silicon carbide, which reduces the interface states density and improves the inversion layer mobility by removing carbon from silicon carbide, said method comprising the steps of:

(a) amorphizing silicon carbide in at least one region of a monocrystalline silicon carbide substrate to convert the silicon carbide in said region to amorphous silicon carbide on said monocrystalline silicon carbide substrate;

(b) removing at least an effective amount of the carbon from the resulting amorphous silicon carbide region with an etchant effective to selectively remove said effective amount of carbon from said amorphous silicon carbide region to produce an amorphous silicon-rich region on said monocrystalline silicon carbide substrate; and (c) forming an oxide on said amorphous silicon-rich region on said monocrystalline silicon carbide substrate by (i) subjecting an etched region to thermal oxidation under conditions that preserve an amorphous silicon layer producing said oxide on said amorphous silicon-rich region on said monocrystalline silicon carbide substrate; or (ii) subjecting an etched region to thermal oxidation under conditions that substantially remove an amorphous silicon layer to produce said oxide on said monocrystalline silicon carbide substrate; or (iii) subjecting an etched region to thermal oxidation under conditions that preserve an amorphous silicon region and thereafter subjecting the said amorphous silicon region to at least one high temperature thermal annealing step to produce said oxide on a crystalline silicon region on said monocrystalline silicon carbide substrate; or (iv) first growing LTO on an etched region and then subjecting the LTO-bearing etched region to thermal oxidation and high temperature anneal to produce an LTO region on said monocrystalline silicon carbide substrate.

2. A method for the production of silicon carbide devices which comprise an oxide region on an amorphous silicon-rich region on a region of a silicon carbide substrate which comprises the steps of:

(a) amorphizing silicon carbide in at least one region of a monocrystalline silicon carbide substrate;

(b) removing at least an amount of carbon from said amorphized silicon carbide with an etchant that etches carbon at a faster rate than it etches silicon and/or silicon carbide to selectively remove said amount of carbon from SiC to produce an amorphous silicon-rich region; and (c) forming an oxide on said amorphous silicon-rich region.

3. A method as claimed in claim 2, wherein the etchant is hot HNO$_3$.

4. A method as claimed in claim 2, wherein said amorphous silicon-rich region is at least predominantly amorphous silicon.

5. A method as claimed in claim 2, wherein said amorphous silicon-rich region is a mixture of predominantly amorphous silicon in combination with amorphous silicon carbide and/or silicon dioxide.

6. A method as claimed in claim 2, wherein said oxide is formed by subjecting the amorphous silicon-rich region to thermal oxidation.

7. A method as claimed in claim 2, wherein said oxide is formed by deposition of an oxide on said amorphous silicon-rich region and subjecting the oxide on said amorphous silicon-rich region to thermal oxidation.

8. A method for the production of silicon carbide devices which comprise an oxide region on a monocrystalline silicon region on a region of a silicon carbide substrate which comprises the steps of:

(a) amorphizing silicon carbide in at least one region of said monocrystalline silicon carbide substrate;

(b) removing at least an amount of carbon from said amorphized silicon carbide with an etchant that etches carbon at a faster rate than it etches silicon and/or silicon carbide to selectively remove said amount of carbon from SiC to produce an amorphous silicon-rich region;

(c) forming an oxide on said amorphous silicon-rich region; and (d) subjecting the oxide on said amorphous silicon-rich region to high temperature thermal anneal to produce an oxide region on a monocrystalline silicon region on a region of said monocrystalline silicon carbide substrate.

9. A method as claimed in claim 8, wherein the etchant is hot HNO$_3$.

10. A method as claimed in claim 8, wherein said amorphous silicon-rich region is at least predominantly amorphous silicon.

11. A method as claimed in claim 8, wherein said amorphous silicon-rich region is a mixture of predominantly amorphous silicon in combination with amorphous silicon carbide and/or silicon dioxide.

12. A method as claimed in claim 8, wherein said oxide is formed by subjecting the amorphous silicon-rich region to thermal oxidation.

13. A method as claimed in claim 8, wherein said oxide is formed by deposition of an oxide on said amorphous silicon-rich region and subjecting the oxide on said amorphous silicon-rich region to thermal oxidation.

14. A method for the production of silicon carbide devices which comprise an oxide region on a region of a silicon carbide substrate which comprises the steps of:

(a) amorphizing silicon carbide in at least one region of a monocrystalline silicon carbide substrate;

(b) removing at least an amount of carbon from said amorphized silicon carbide with an etchant that etches carbon at a faster rate than it etches silicon and/or silicon carbide to selectively remove said amount of carbon from SiC to produce an amorphous silicon-rich region; and (c) subjecting the etched surface to thermal oxidation under conditions effective to oxidize the amorphous silicon layer.

15. A method as claimed in claim 14, wherein the etchant is hot $HNO_3$.

16. A method as claimed in claim 14, wherein an oxide is formed on said amorphous silicon-rich region prior to said thermal oxidation.

17. A method as claimed in claim 14, wherein said amorphous silicon-rich region is at least predominantly amorphous silicon.

18. A method as claimed in claim 14, wherein said amorphous silicon-rich region is a mixture of predominantly amorphous silicon in combination with amorphous silicon carbide and/or silicon dioxide.

19. A method for the production of silicon carbide devices which comprise an oxide region on an amorphous silicon region on a surface region of a silicon carbide substrate which comprises the steps of:

(a) providing a monocrystalline silicon carbide substrate;

(b) subjecting at least a portion of a surface of the substrate to ion implantation to convert at least a portion of the substrate surface to amorphous silicon carbide producing a region of amorphous silicon carbide on said monocrystalline silicon carbide substrate;

(c) subjecting at least a portion of the amorphous silicon carbide region to an etchant material which selectively removes carbon to produce a region of amorphous silicon on said monocrystalline silicon carbide substrate; and (d) subjecting the monocrystalline silicon carbide substrate with at least a region of amorphous silicon to thermal oxidation.

20. A method for the production of silicon carbide devices which comprise an oxide region on a monocrystalline silicon layer on a surface region of a silicon carbide substrate which comprises the steps of:

(a) providing a monocrystalline silicon carbide substrate;

(b) subjecting at least a portion of a surface of the substrate to ion implantation to convert at least a portion of the substrate surface to amorphous silicon carbide producing a region of amorphous silicon carbide on said monocrystalline silicon carbide substrate;

(c) subjecting at least a portion of the amorphous silicon carbide region to an etchant material which selectively removes carbon to produce a region of amorphous silicon on said monocrystalline silicon carbide substrate;

(d) subjecting the monocrystalline silicon carbide substrate with at least a region of amorphous silicon to thermal oxidation; and (e) subjecting the oxidized surface to high temperature thermal anneal to produce an oxide on a monocrystalline silicon layer on a surface region of said monocrystalline silicon carbide substrate.

21. A method for the production of silicon carbide devices which comprise an oxide region on a surface region of a monocrystalline silicon carbide substrate which comprises the steps of:

(a) providing said monocrystalline silicon carbide substrate;

(b) subjecting at least a portion of a surface of the substrate to ion implantation to convert at least a portion of the substrate surface to amorphous silicon carbide producing a region of amorphous silicon carbide on said monocrystalllne silicon carbide substrate;

(c) subjecting at least a portion of the amorphous silicon carbide region to an etchant material which selectively removes carbon to produce a region of amorphous silicon on said monocrystalline silicon carbide substrate; and (d) subjecting the etched surface to thermal oxidation under conditions effective to oxidize the amorphous silicon layer to produce an oxide on a surface region of said monocrystalllne silicon carbide substrate.

\* \* \* \* \*